US012794466B2

(12) United States Patent
Zhao

(10) Patent No.: US 12,794,466 B2
(45) Date of Patent: Nov. 10, 2026

(54) GATE VOLTAGE DETECTOR

(71) Applicant: TEXAS INSTRUMENTS INCORPORATED, Dallas, TX (US)

(72) Inventor: Xiaochun Zhao, Allen, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 18/474,314

(22) Filed: Sep. 26, 2023

(65) Prior Publication Data

US 2025/0105839 A1 Mar. 27, 2025

(51) Int. Cl.
*H03K 17/687* (2006.01)
*G01R 19/00* (2006.01)
*H03K 19/20* (2006.01)

(52) U.S. Cl.
CPC ..... *H03K 17/6871* (2013.01); *G01R 19/0038* (2013.01); *H03K 19/20* (2013.01)

(58) Field of Classification Search
CPC . H03K 17/6871; H03K 19/20; G01R 19/0038
See application file for complete search history.

(56) References Cited

U.S. PATENT DOCUMENTS 11,038,502 B1 * 6/2021 Xie .......................... H02M 1/08
2002/0021150 A1 2/2002 Tuchiya
2011/0187439 A1 8/2011 Sugie
2019/0305774 A1 10/2019 Zella

FOREIGN PATENT DOCUMENTS

EP 3595153 A1 * 1/2020 ............. G05F 1/561

OTHER PUBLICATIONS

PCT Search Report mailed Jan. 21, 2025.

* cited by examiner

*Primary Examiner* — Metasebia T Retebo
(74) *Attorney, Agent, or Firm* — Charles F. Koch

(57) ABSTRACT

An apparatus includes a circuit including a circuit input, a circuit output, and a circuit terminal. A current mirror has a mirror input and a mirror output. The mirror input is coupled to the circuit terminal. A logic gate has a logic gate input coupled to the mirror output. A resistor is coupled between the mirror output and a supply reference terminal. A transistor has a control input and a current terminal. The control input is coupled to the circuit input. The current terminal is coupled to the circuit output.

21 Claims, 5 Drawing Sheets

GATE VOLTAGE DETECTOR

BACKGROUND

In many applications, a control unit (e.g., a microcontroller unit) causes power to turn on to a load through a solid-state switch (e.g., transistor). The transistor is coupled between a power source (e.g., a battery) and the load. The control unit generates a signal which causes the transistor to turn on thereby coupling the battery's voltage to the load. Such power control systems can be included in, for example, an automobile.

SUMMARY

In one example, an apparatus includes a circuit including a circuit input, a circuit output, and a circuit terminal. A current mirror has a mirror input and a mirror output. The mirror input is coupled to the circuit terminal. A logic gate has a logic gate input coupled to the mirror output. A resistor is coupled between the mirror output and a supply reference terminal. A transistor has a control input and a current terminal. The control input is coupled to the circuit input. The current terminal is coupled to the circuit output.

DETAILED DESCRIPTION

Figure 1:
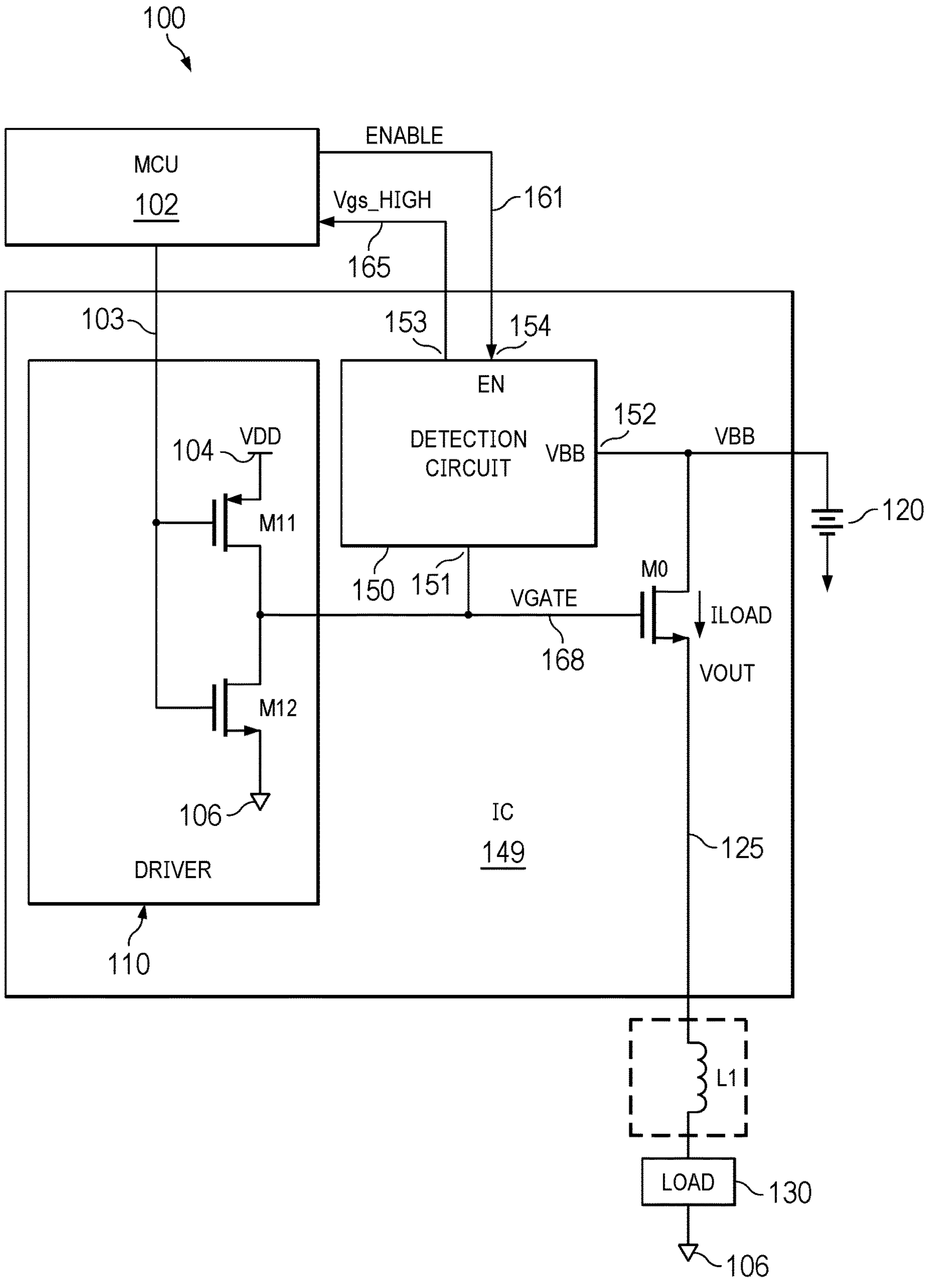
FIG. 1 is a schematic diagram of a system including a detection circuit, in accordance with an example.

The same reference numbers or other reference designators are used in the drawings to designate the same or similar (either by function and/or structure) features.

FIG. 1 is a schematic diagram of a system 100 including a microcontroller unit 102, a transistor M0, a driver 110, a battery 120, a load 130, and a detection circuit 150. In one example, battery is an automobile's battery (e.g., 12V) and produces a voltage VBB. In the case of an electric vehicle, battery 120 may be a voltage VBB derived from the vehicle's battery pack (derived, for example, from a direct current (DC)-to-DC converter). Load 130 represents any subsystem. In the example of an automobile, load 130 may be an infotainment system, the antilock brake system (ABS), etc. Transistor M0 is coupled between battery 120 and the load 130. Cable 125 connects transistor M0 to load 130. Cable 125 has a parasitic inductance L1 which is a function, in part, of the length of the cable. For a "high side" switch configuration, transistor M0 is physically close to battery 120 and fairly far from load 130. Thus, cable 125 may have a length that results in a substantial parasitic inductance L1.

In the example of FIG. 1, transistor M0, driver 110, and detection circuit 150 are fabricated as part of the same integrated circuit (IC) 149. MCU 102 may be fabricated on a different IC. In other examples, detection circuit 150 may be fabricated on the same IC, and transistor M0 may be separate from that IC. In yet another example, MCU 102, driver 110, detection circuit 150, and transistor M0 may be fabricated on the same IC. Further still, MCU 102, driver 110, and detection circuit 150 may be fabricated on one IC, and transistor M0 being fabricated as a separate component.

When transistor M0 is on, current from battery 120 can flow through the transistor to power load 130. Transistor M0 is suitably sized to accommodate the load current Iload to load 130. When transistor M0 is off, voltage VBB is decoupled from load 130 thereby turning off load 130. In this example, transistor M0 is an n-channel field effect transistor (NFET). The drain of transistor M0 is coupled to battery 120, and the source of transistor M0 is coupled to load 130. The voltage on the drain of transistor M0 is VBB, and the voltage on the source of transistor M0 is VOUT. Voltage VOUT is approximately equal to VBB. Voltage VOUT is equal to VBB less the drain-to-source voltage (Vds) of transistor M0, which is relatively small compared to the magnitude of VBB.

The MCU 102 can cause transistor M0 to turn on by generating a control signal 103. The MCU 102 is coupled to driver 110. Driver 110 is the gate driver for transistor M0. Driver 110 includes transistors M11 and M12. In this example, transistor M11 is a p-channel field effect transistor (PFET), and transistor M12 is an NFET. Transistors M11 and 12 are coupled in series between a supply voltage terminal 104 (VDD) and the ground terminal 106. Control signal 103 is coupled to the gates of transistors M11 and M12. The drains of transistors M11 and M12 are coupled together and to the gate of transistor M0. The voltage VGATE 168 is the voltage on the gate of transistor M0. When transistor M11 is turned on (e.g., by a logic low of control signal 103 from MCU 102), the voltage VGATE is pulled upward towards the VDD. When VGATE is more than the threshold voltage (Vt) of transistor M0 above VOUT (its source voltage), transistor M0 turns on. When transistor M12 is turned on (control signal high), the gate of transistor M0 is pulled low thereby turning off transistor M0.

Detection circuit 150 includes inputs 151 and 154 and outputs 152 and 153. Input 151 is coupled to the gate of transistor M0, and output 152 is coupled to the drain of transistor M0. Output 153 and input 154 are coupled to MCU 102. Detection circuit 150 determines whether voltage VGATE 168 is greater than VOUT plus the Vt of transistor M0. In response to determining that VGATE 168 is greater than VOUT plus the Vt of transistor M0, detection circuit 150 forces an output signal Vgs_High 165 on its output 153 to a first logic state (e.g., logic high). In response to determining that VGATE 168 is not greater than VOUT plus the Vt of transistor M0, detection circuit 150 forces its output signal Vgs_High 165 to a second logic state (e.g., logic low). Detection circuit 150 thus provides a feedback indication (signal Vgs_High 165) to MCU 102 as to whether transistor M0 has turned on in response to the MCU attempting to turn on transistor M0. Such a feedback indication can be useful for safety reasons in an automobile. MCU 102 also may generate an enable signal (ENABLE) 161 to input 154 of detection circuit 150 to enable or disable the detection circuit. Disabling detection circuit 150 may be useful to, for example, reduce the magnitude of the quiescent current through the detection circuit.

When transistor M0 turns on, current Iload begins to flow, and energy is stored in parasitic inductance L1. At steady state (current Iload is a DC current), the voltage drop across parasitic inductance L1 is approximately 0V. However, when MCU 102 asserts control signal 103 to a logic state (e.g., logic high) to turn off transistor M0, current Iload suddenly ceases. The rapid decrease in current Iload causes the previously stored inductive energy to be dissipated, which may result in the voltage VOUT becoming negative relative to ground. In one example, VOUT may be −30V. Voltage VGATE 168 is a threshold voltage above VOUT. If VOUT becomes negative, so does VGATE. For example, if VOUT is −30V when transistor M0 turns off, then VGATE may be −29V. Accordingly, a design consideration for detection circuit 150 should consider that the input voltage (VGATE) at terminal 151 may be a negative voltage relative to ground. Another design consideration for detection circuit 150 is that voltages VBB and VGATE may be fairly large positive voltages. For example, VBB may range from 3V to 40V, and VGATE may be 12V higher than VBB. Accordingly, in this example, VGATE may range from −29V to 52V.

Figure 2:
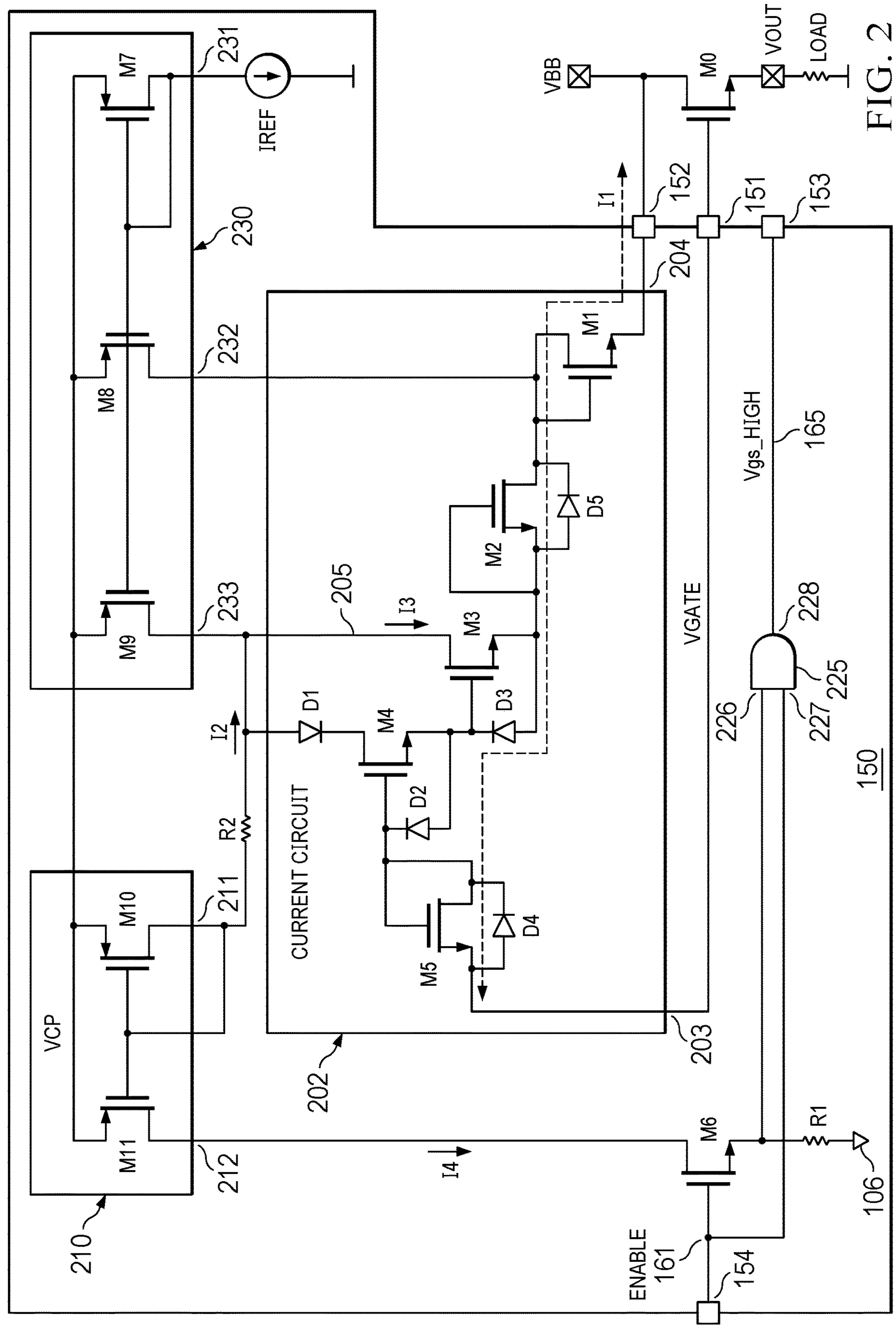
FIG. 2 is a schematic diagram of the detection circuit of FIG. 1, in accordance with an example.

FIG. 2 is a schematic diagram of detection circuit 150 adapted to accommodate VGATE ranging from a negative voltage to a large positive voltage. Detection circuit 150 in the example of FIG. 2 includes a voltage-controlled current circuit 202, current mirrors 210 and 230, resistors R1 and R2, a current reference source IREF, a transistor M6, and an AND gate 225. Voltage-controlled current circuit 202 includes an input 203, an output 204, and a circuit terminal 205. Input 203 is coupled to input 151 of detection circuit 150 and to the gate of transistor M0. Output 204 is coupled to output 152 of detection circuit 150 and to the drain of transistor M0. In this example, voltage-controlled current circuit 202 includes transistors M1, M2, M3, M4, and M5 and diodes D1, D2, and D3. Transistors M1-M5 are NFETs. The source of transistor M1 is coupled to input 203. The drain and gate of transistor M5 are coupled together (diode-connected transistor) and to the gate of transistor M4. Diode D4 is the back gate diode (sometimes referred as the body diode) of transistor M5. The anode of diode D2 is coupled to the source of transistor M4, and the cathode of diode D2 is coupled to the gate of transistor M4. The source of transistor M4 is coupled to the gate of transistor M3. The anode of diode D3 is coupled to the source of transistor M3, and the cathode of diode D3 is coupled to the gate of transistor M3. The source of transistor M3 is coupled to the source and gate of transistor M2. The drain of transistor M3 is coupled to circuit terminal 205. The drain of transistor M2 is coupled to the gate and drain of transistor M1. Transistor M1 is diode-connected. Diode D5 is the back gate diode of transistor M2. The source of transistor M1 is coupled to output 152 of detection circuit 150 and to the drain of transistor M0.

Current mirror 210 includes PFETs M10 and M11. The gates of transistors M10 and M11 are coupled together and to the drain of transistor M10. The sources of transistors M10 and M11 are coupled together and receive a voltage VCP from a charge pump (not shown). In one example, voltage VCP is 12V higher than VBB (VCP=VBB+12V). Current mirror 210 has a mirror input 211 and a mirror output 212. Resistor R2 is coupled between mirror input 211 and circuit terminal 205. The anode of diode D1 is coupled to resistor R2, and the cathode of diode D1 is coupled to the drain of transistor M4.

Transistor M6 and resistor R1 are coupled in series between current mirror output 212 and the ground terminal 106, with the drain of transistor M6 coupled to mirror output 212 and the source of transistor M6 coupled to resistor R1. The gate of transistor M6 is coupled to input 154 of detection circuit 150 and receives the enable signal ENABLE 161. AND gate 225 includes AND gate inputs 226 and 226 and an AND gate output 228. The connection between transistor M6 and resistor R1 is coupled to AND gate input 226, and the detection circuit input 154 is coupled to AND gate input 227. Accordingly, AND gate input 226 receives the voltage across resistor R1. AND gate output 228 is coupled to the output 153 of detection circuit 150 and generates the output signal Vgs_High 165. In other examples, a different logic gate or combination of logic gates can be included instead of AND gate 225.

Current mirror 230 includes PFETs M7, M8, and M9. The sources of transistors M7-M9 are coupled together and to VCP. The gates of transistors M7-M9 are coupled together and to the drain of transistor M7 and to the reference current source IREF. Current mirror 230 has a mirror input 231 and mirror outputs 232 and 233. Mirror input 231 is coupled to the current reference source IREF. Mirror outputs 232 and 233 are coupled to the drain of transistor M8 and to the drain of transistor M9, respectively. Mirror output 232 is coupled to the drains of transistors M1 and M2. Mirror output 233 is coupled to circuit terminal 205.

When voltage VGATE 168 is greater than voltage VOUT by at least the threshold voltage of transistor M0, transistor M0 turns on. Because the Vds of transistor M0 is small (on the order of millivolts), detection circuit 150 detects whether voltage VOUT is greater than the drain voltage (VBB) of transistor M0 by at least the threshold voltage of the transistor. In one example, the threshold voltage of transistor M0 may range from 1V to 2.6V. Detection circuit 150 detects whether voltage VGATE 168 is at least, for example, 3V above voltage VBB. The configuration of transistors M1-M5 is such that when voltage VGATE is at least, for example, 3V above voltage VBB, the back gate diode D4 of transistor M5 is forward biased. With back gate diode D4 forward biased, the voltage on the gate of transistor M4 will be high enough to high enough (larger than its source voltage by at least the threshold voltage of transistor M4) that transistor M4 will turn on. Transistor M4 turning on pulls up the gate voltage of transistor M3 thereby turning on transistor M3. Transistor M9 within current mirror 230 pulls up the voltage on circuit terminal 205 and the drain of transistor M3, and with transistor M3 on, the voltage on the source of transistor M3 will be high enough to cause back gate diode D5 to be forward biased. The voltage on the gate and drain of diode-connected transistor M1 will then be high enough to cause a diode voltage drop between drain and source of transistor M1.

With transistor M3 on, current I2, which is the current through resistor R2, can flow through transistor M3, forward-biased diode back gate diode D5, diode-connected transistor M1, and through transistor M0. Resistor R2 limits the magnitude of current I2. Current mirror 210 mirrors current I2 through its output 212 as current I4. In one example, the mirror ratio of current mirror 210 is 1:1 and thus current I4 will equal current I2 when current I2 begins to flow. Current I4 flows through transistor M6, which is turned on when the enable signal ENABLE 161 is logic high. Current I4 also flows through resistor R1, and a voltage develops across resistor as a result. The voltage across resistor R1 is provided to gate input 226 of AND gate 225. When the enable signal ENABLE 161 is logic high, the voltage across resistor R1 resulting from current I4 flowing through resistor R1 causes AND gate 225 to generate a logic high on its gate output 228 as output signal Vgs_high 165. Accordingly, output signal Vgs_High being logic high results from voltage VGATE 168 being high enough to cause back gate diodes D4 and D5 to be forward biased and transistors, M1, M3, and M4 to be on, which is the case when voltage VGATE is high enough that transistor M0 is on. Logic high for output signal Vgs_High indicates that transistor M0 is on.

When voltage VGATE 168 is not high enough for all of the back gate diodes D4 and D5 to be forward biased and transistors, M1, M3, and M4 to be on, current I2 cannot flow (I2=0 amperes) because transistor M3 is off. With current I2 equal to 0 amperes, current I4 also is off (I4=0 amperes), and no current flows through resistor R1, and thus the voltage across resistor R1 is 0 volts and AND gate 225 forces output signal Vgs_High 165 to a logic low level. Accordingly, output signal Vgs-High being logic low indicates that voltage VGATE is not high enough for transistor M0 to be on. Logic low for output signal Vgs_High indicates that transistor M0 is off. Advantageously, when output signal Vgs_High 165 is logic low, there is no or very little quiescent current flowing through voltage-controlled current circuit 202, and current I4 also is 0 amperes.

The types of transistors chosen for transistors M1-M5 in the example of FIG. 2 takes into account the fact that voltage VGATE 168 may range from being a large negative voltage (e.g., −29V in one example) to a large positive voltage (e.g., VBB+12V). Voltage VBB may be, for example, a voltage between 3V and 40V, and thus voltage VGATE may be as positive as 52V. Voltage VGATE 168 is coupled to a terminal (e.g., the source) of transistor M5. Even though voltage VGATE may be as high as, for example, 52V, choosing a high voltage transistor to implement as transistor M5 may not work because voltage VGATE may be a negative voltage when transistor M0 is turned, and, as described below regarding FIG. 3, a high voltage NFET does not have isolation between its drain and n-channel buried layer (NBL) and thus cannot have a negative voltage on its drain.

Figure 3:
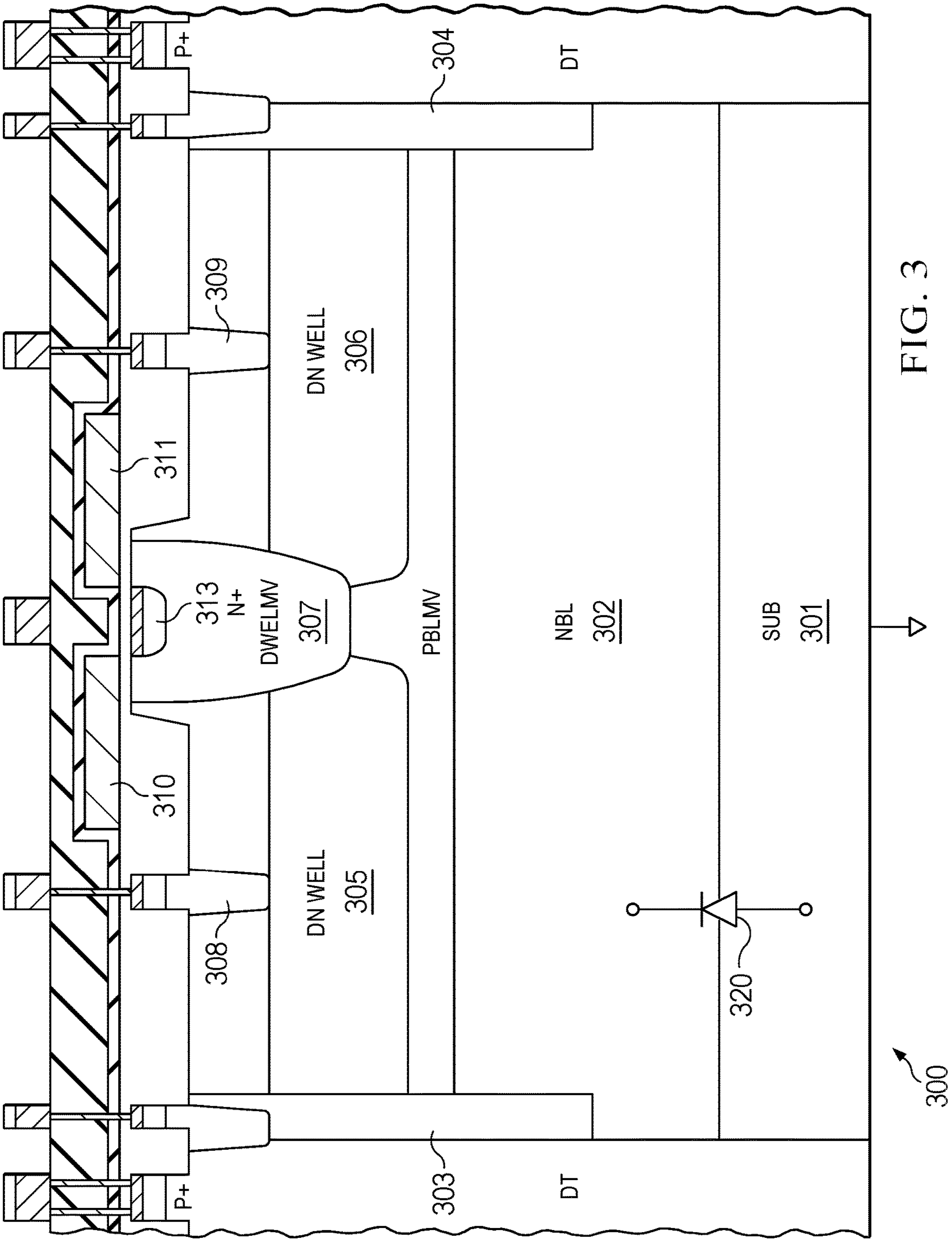
FIG. 3 is a cross-sectional view of an n-type field effect transistor (NFET) whose drain is not isolated from the n-type buried layer (NBL), in accordance with an example.

FIG. 3 is a cross-sectional view of a high voltage NFET 300. A high voltage NFET is a transistor for which the voltage between certain pairs of terminals—e.g., drain-to-source and gate-to-drain—can be as high as, for example, 60V. The NFET 300 in the example of FIG. 3 includes a p-type substrate 301, an NBL 302, deep n-regions 303 and 304, deep n-type wells (DN WELLs) 305 and 306, back gate 307, drains 308 and 309, gates 310 and 311, and source 313. The NBL 302 is electrically coupled to the drains 308 and 309 through the deep n-regions 303 and 304 and DN WELLs 305 and 306, and thus the drains 308/309 are not isolated from NBL 302. Accordingly, a voltage imposed on the drains 308 and 309 is also provided to NBL 302. Because NBL 302 has n-type doping and substrate 301 has p-type doping, a PN junction 320 forms between p-type substrate 301 and NBL 302. The p-type substrate 301 can be connected to the ground potential. With the anode of the PN junction 320 connected to ground, the voltage on NBL 302 may be approximately −0.7V relative to ground. If a voltage more negative than −0.7V were to be imposed on the drains 308 and 309, the cathode of PN junction 320 would also be at a voltage more negative than −0.7V and the forward bias voltage across the PN junction would be larger than 0.7V, and thereby possibly damaging to PN junction 320 and the NFET 300 in general. Accordingly, an NFET in which the drain is not isolated from the NBL should not be exposed to a negative voltage relative ground.

Referring back to FIG. 2, transistor M5 has its source connected to the gate of transistor M0. The voltage on the drain of transistor M5 is a diode voltage drop less than its source voltage when its gate voltage is higher than voltage VBB. If voltage VGATE is a negative voltage (which may occur when transistor M0 is turned off as described above), then the voltage on the drain of transistor M5 will also be a negative voltage. For example, if voltage VGATE is −29V, then the voltage on the drain of transistor M5 may be approximately −28V. Because the drain of NFET M5 can have a negative voltage, transistor M5 may not be implemented as an NFET whose drain is not isolated from its NBL. Instead, transistor M5 may be implemented as an NFET whose drain is isolated from its NBL. Such isolated NFETs may be lower voltage devices (e.g., transistors whose maximum voltage between any pair of terminals is limited to, for example, 5V).

Figure 4:
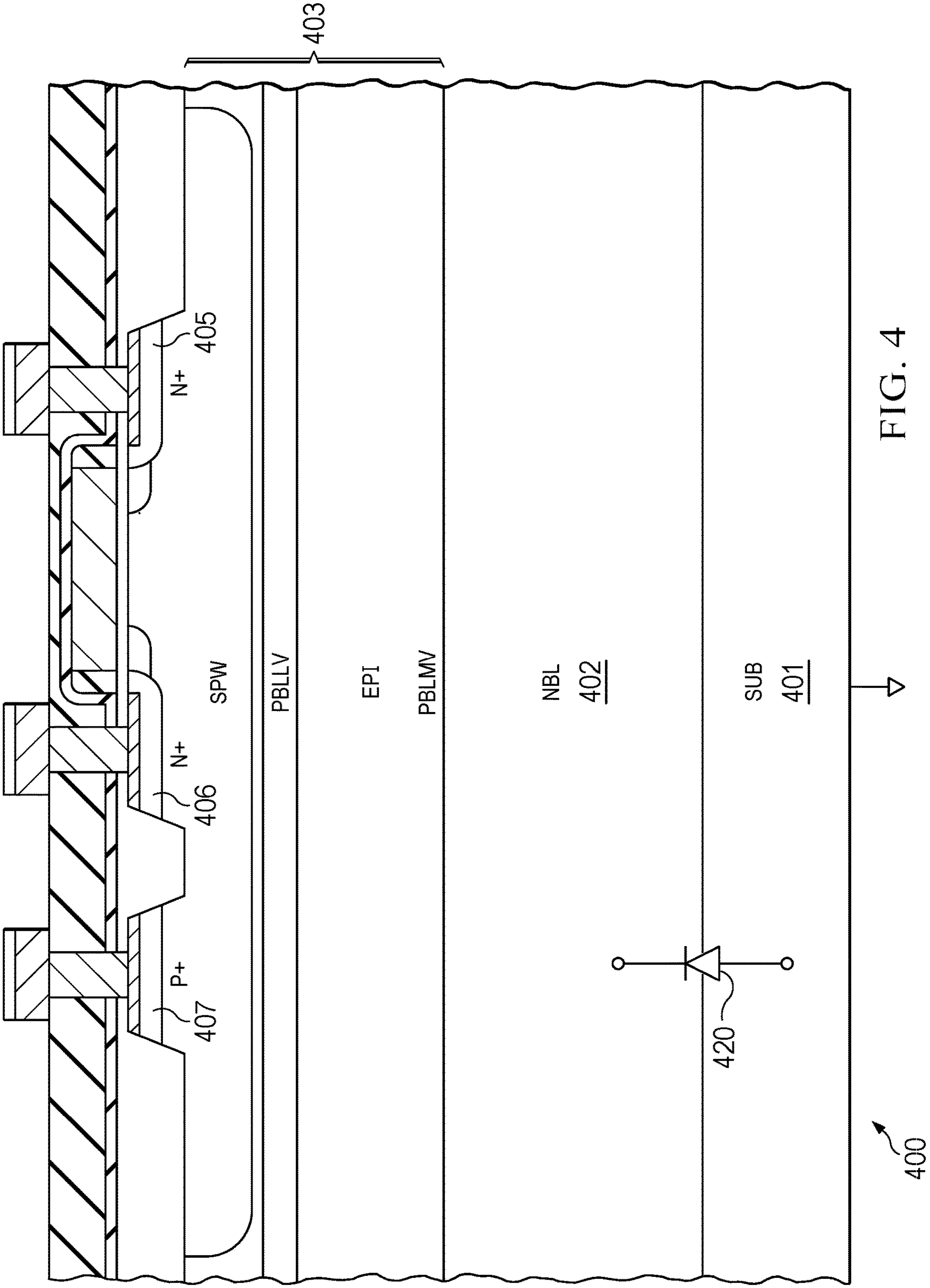
FIG. 4 is a cross-sectional view of an NFET) whose drain is isolated from the NBL, in accordance with an example.

FIG. 4 is a cross-sectional view of an isolated NFET 400, that is, an NFET whose drain is isolated from its NBL. Isolated NFET 400 in the example of FIG. 4 includes a p-type substrate coupled to ground, NBL 402, multiple layers 403, drain 405, and source 406. A PN junction 420 is formed between p-type substate 401 and n-type NBL 402. Layers 403 include p-type material. Drain 405, source 406, and NBL are n-type material. P-type layers 403 isolate n-type drain 405 and n-type source 406 from NBL 402. Accordingly, a negative voltage imposed on drain 405 is not also provided to the cathode of PN junction 420 thereby allowing the isolated NFET 400 to have a negative voltage on its drain without damaging the transistor.

Referring again to FIG. 2, transistor M5 may be implemented as an isolated NFET. As an isolated NFET, transistor M5 will not be damaged if a negative voltage were applied to its drain. As an isolated NFET, the voltage between any pair of terminals (gate, source, drain) of transistor M5 is limited to relatively low voltage levels (e.g., 5V). The drain of transistor M5 is connected to its gate and thus the voltage between the drain and gate is 0V. The voltage between the source and either the gate or drain of transistor M5 is approximately 1V due to the forward bias voltage drop across back gate diode D4. Accordingly, the voltage difference between any pair of terminals is low enough that an isolated NFET can be used as transistor M5.

Transistors M3 and M4 can be implemented as non-isolated, and thus higher voltage, transistors because only their gates and sources (not their drains) will have a negative voltage if voltage VGATE becomes negative. The drain of transistor M4 is coupled through diode D1 to the drain of transistor M9, and the drain of transistor M3 is coupled to the drain of transistor M9. Voltage VCP is a positive voltage and is provided to the source of transistor M9. Accordingly, neither the drains of transistors M3 or M4 will receive a negative voltage, and thus transistors M3 and M4 can be implemented as non-isolated NFETs.

Similarly, transistor M2 can be implemented as a non-isolated (higher voltage) transistor because its source and gate may receive a negative voltage but not its drain. Instead, the drain of transistor M2 is coupled to the drain of transistor M8. Because the source of transistor M8 receives the positive voltage VCP, the drain of transistor M2 will receive a positive voltage, and not a negative voltage. Because the drain of transistor M1 also is coupled to the drain of transistor M8, and thus receives a positive voltage, transistor M1 also can be implemented as a non-isolated (higher voltage) transistor.

Accordingly, the particular configuration and types of transistors M1-M5 in the voltage-controlled current circuit 202 in the example of FIG. 2 are such that detection circuit 150 can detect whether voltage VGATE is high enough for transistor M0 to be on while also being able to sustain relatively large negative and positive voltages, as described above.

Figure 5:
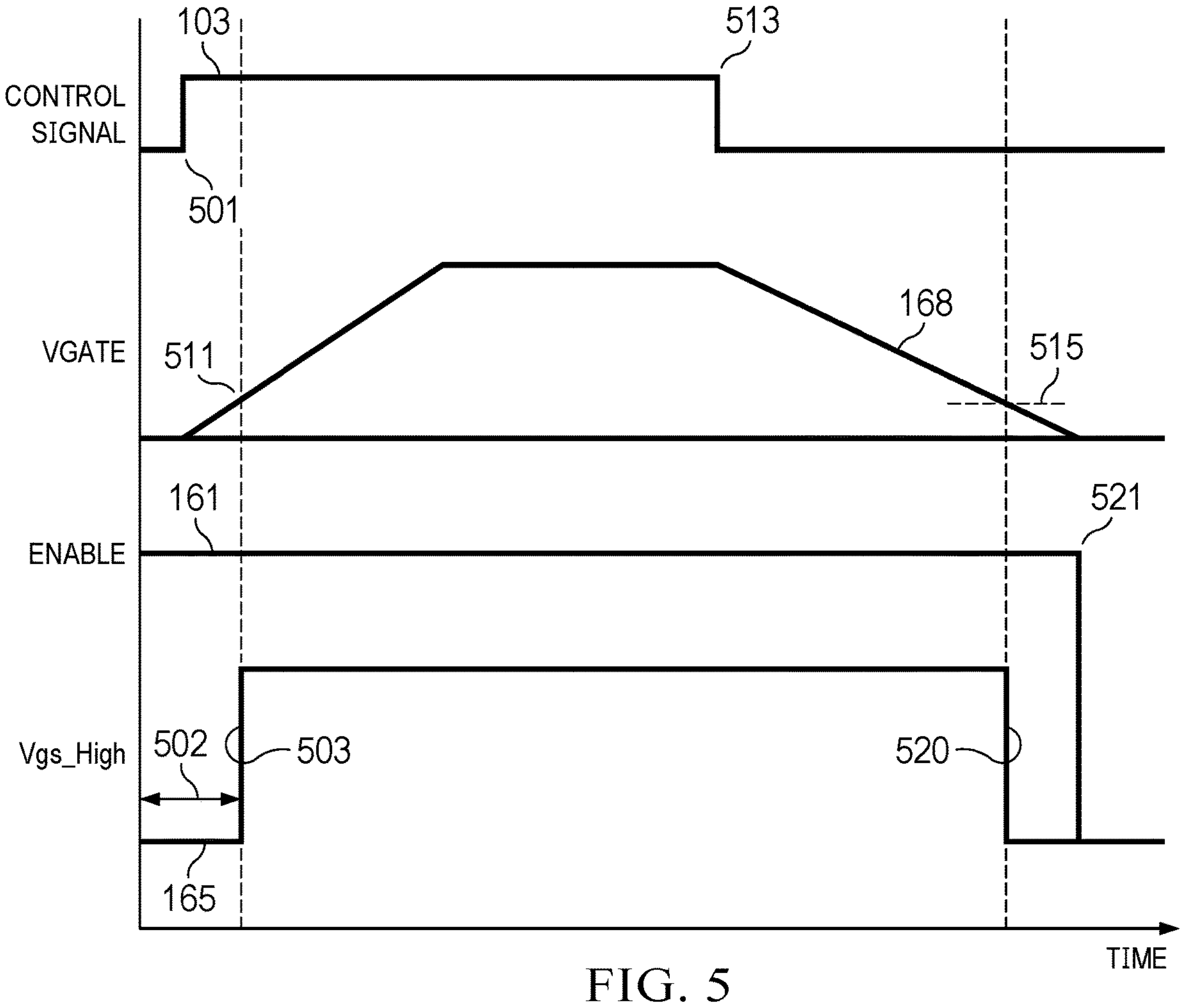
FIG. 5 are waveforms illustrating the operation of the detection circuit, in accordance with an example.

FIG. 5 are waveforms illustrating the operation of detection circuit 150. The waveforms in FIG. 5 include control signal 103 from MCU 102, voltage VGATE 168, enable signal ENABLE 161, and output signal Vgs_High 165. Enable signal ENABLE 161 is logic high thereby enabling detection circuit 150 until time point 521, at which point enable signal ENABLE transitions to logic low thereby disabling detection circuit 150.

At time point 501, MCU 102 asserts control signal 103 logic high to begin to turn on transistor M0. In response, the voltage on the gate of transistor M0 (voltage VGATE) begins to increase as the gate capacitance of transistor M0 charges. Until time point 511, voltage VGATE is not high enough for both of the back gate diodes D4 and D5 to be forward biased and transistors, M1, M3, and M4 to be on. Accordingly, detection circuit 150 forces output signal Vgs_High 165 to be logic low as indicated at 502. At time point 511, VGATE is high enough for all of the back gate diodes D4 and D5 to be forward biased and transistors, M1, M3, and M4 to be on, and detection circuit 150 causes output signal Vgs_High 165 to transition from a logic low level to a logic high level as indicated at 503. That output signal Vgs_High 165 is logic high provides an indication to MCU 102 that transistor M0 is on.

At time point 513, MCU 102 forces control signal 103 to a logic low level to cause transistor M0 to turn off. In response, the voltage VGATE 168 decreases. In response to voltage VGATE 168 falling to level 515, at least one of: the back gate diodes D4 and D5 is not forward biased and transistors, M1, M3, and M4 are off. Current I2 can no longer flow, detection circuit 150 forces its output signal Vgs_High 165 to a logic low level as indicated at 520.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

References may be made in the claims to a transistor's control input and its current terminals. In the context of a FET, the control input is the gate, and the current terminals are the drain and source.

References herein to a FET being "on" or "enabled" means that the conduction channel of the FET is present and drain current may flow through the FET. References herein to a FET being "off" or "disabled" means that the conduction channel is not present so drain current does not flow through the FET. An "off" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described embodiments, and other embodiments are possible, within the scope of the claims.

What is claimed is:

1. An apparatus, comprising:

a detector circuit having a first terminal, a second terminal, and an output, the first terminal coupled to a power input, the second terminal coupled to a switch control terminal, the detector circuit configurable to:

detect that a transistor is on by detecting a voltage difference between the second terminal and the first terminal, in which a voltage at the second terminal has a range between a positive value and a negative value; and provide a signal at its output indicative of the voltage difference exceeds a threshold indicative of the transistor being on.

2. The apparatus of claim 1, wherein the detector circuit includes a circuit, the circuit including:

a current mirror having a mirror input and a mirror output;

a first resistor having a first terminal coupled to the mirror output and having a second terminal coupled to a supply reference terminal;

a logic gate having a logic gate input coupled to the mirror output and an output coupled to the output of the detector circuit;

a first transistor coupled between the first and second terminals of the detector circuit, the first transistor being diode-connected; and a second transistor coupled between the mirror input and the second terminal, the second transistor having a control terminal coupled to a control terminal and a current terminal of the first transistor.

3. The apparatus of claim 2, wherein the circuit comprises:

a third transistor coupled between the mirror input and the control terminal of the second transistor, the third transistor having a control terminal coupled to the control terminal and the current terminal of the first transistor.

4. The apparatus of claim 3, further comprising:

a fourth transistor coupled between the second transistor and the first terminal.

5. The apparatus of claim 4, further comprising:

a fifth transistor coupled between the fourth transistor and the first terminal, the fifth transistor being diode-connected.

6. The apparatus of claim 3, wherein the first transistor is an n-type field effect transistor (NFET) having a source, a drain, and a first n-type buried layer (NBL), the first NBL isolated from the source and the drain.

7. The apparatus of claim 6, wherein:

the second transistor is an NFET, and the second transistor has a second NBL coupled to a drain of the second transistor; and the third transistor is an NFET and has a source a drain, and a third NBL coupled to the drain of the third transistor.

8. The apparatus of claim 5, wherein the current mirror is a first current mirror, the mirror input is a first mirror input, the mirror output is a first mirror output, and the apparatus further comprises:

a second current mirror having a second mirror input, a second mirror output, and a third mirror output, the second mirror output coupled to a current terminal of the second transistor, and the third mirror output coupled to a current terminal of the fifth transistor.

9. The apparatus of claim 1, wherein the detector circuit comprises:

a first transistor configured as diode-connected transistor having a current terminal coupled to the second terminal;

a second transistor having a first control input coupled to the first transistor and having first and second current terminals;

a third transistor having a second control input coupled to the first current terminal and having third and fourth current terminals;

a fourth transistor configured as a diode-connected transistor and coupled to the fourth current terminal; and a fifth transistor configured as a diode-connected transistor coupled to the fourth transistor and has a current terminal coupled to the first terminal.

10. An apparatus, comprising:

a current mirror having a mirror input and a mirror output;

a circuit including a circuit input, a circuit output, and a circuit terminal, the circuit terminal coupled to the mirror input, the circuit configured to conduct a current from the current mirror responsive to a first voltage on the circuit input being larger than a voltage on the circuit output by a threshold value, the circuit comprising:

a first transistor configured as diode-connected transistor;

a second transistor having a control input coupled to the first transistor and having first and second current terminals, the first current terminal coupled to the circuit terminal; and a third transistor configured as a diode-connected transistor and coupled to the second current terminal;

a resistor having a first terminal coupled to the mirror output and having a second terminal coupled to a supply reference terminal, and a logic gate having a logic gate input and a logic gate output, the logic gate input coupled to the resistor, the logic gate configured to generate a logic signal on the logic gate output at a first logic state responsive to a second voltage across the resistor being larger than a second threshold value.

11. The apparatus of claim 10, further comprising:

a fourth transistor having a control input coupled to the first transistor and having first and second current terminals, the second current terminal coupled to the control input of the second transistor.

12. The apparatus of claim 10, further comprising:

a fourth transistor configured as a diode-connected transistor and having a first terminal coupled to the third transistor and having a second terminal coupled to the circuit output.

13. The apparatus of claim 10, wherein the current mirror is a first current mirror, the mirror input is a first mirror input, the mirror output is a first mirror output, the third transistor has a third current terminal, and the apparatus further comprises:

a second current mirror having a second mirror input, a second mirror output, and a third mirror output, the second mirror output coupled to the first current terminal of the second transistor, and the second mirror output coupled to the third current terminal of the third transistor.

14. The apparatus of claim 10, wherein the logic gate is an AND gate.

15. An apparatus, comprising:

a transistor having a control input and a current terminal;

a current mirror having a mirror input and a mirror output;

a circuit including a circuit input, a circuit output, and a circuit terminal, the circuit input coupled to the control input, the circuit output coupled to the current terminal, and the circuit terminal coupled to the mirror input, the circuit configured to conduct a current from the current mirror responsive to a first voltage on the circuit input being larger than a voltage on the circuit output by a threshold value;

a resistor having a first terminal coupled to the mirror output and having a second terminal coupled to a supply reference terminal, and an AND gate having an AND gate input and an AND gate output, the AND gate input coupled to the resistor, the AND gate configured to generate a logic signal on the AND gate output at a first logic state responsive to a second voltage across the resistor being larger than a second threshold value.

16. The apparatus of claim 15, wherein the transistor is a first transistor, the control input is a first control input, and the current terminal is a first current terminal, and the circuit comprises:

a second transistor configured as diode-connected transistor;

a third transistor having a second control input coupled to the second transistor and having second and third current terminals;

a fourth transistor having a third control input coupled to the second current terminal and having fourth and fifth current terminals;

a fifth transistor configured as a diode-connected transistor and coupled to the fifth current terminal.

17. The apparatus of claim 16, wherein:

the second transistor is an n-type field effect transistor (NFET) having a source, a drain, and a first n-type buried layer (NBL), the first NBL isolated from the source and drain; and the fourth transistor is an NFET, the fourth current terminal is a drain, the fifth current terminal is a source, and the fourth transistor has a second NBL coupled to the drain of the fourth transistor.

18. The apparatus of claim 16, further comprising a sixth transistor configured as a diode-connected transistor having a first terminal coupled to the fifth transistor and having a second terminal coupled to the circuit output.

19. The apparatus of claim 2, wherein the circuit is a voltage-controlled current circuit.

20. The apparatus of claim 10, wherein the circuit is a voltage-controlled current circuit.

21. The apparatus of claim 2, wherein the threshold is set based on a forward voltage of the first transistor.

* * * * *